US011483005B1

(12) United States Patent
Uvieghara et al.

(10) Patent No.: US 11,483,005 B1
(45) Date of Patent: Oct. 25, 2022

(54) SYSTEM REFERENCE (SYSREF) SIGNAL SYSTEM AND METHOD

(71) Applicant: IQ-Analog Corporation, San Diego, CA (US)

(72) Inventors: Gregory Uvieghara, Murrieta, CA (US); Kenneth Pettit, San Diego, CA (US); Costantino Pala, San Diego, CA (US); Mikko Waltari, Escondido, CA (US)

(73) Assignee: IQ-Analog, Inc., San Diego, CA (US)

( * ) Notice: Subject to any disclaimer, the term of this patent is extended or adjusted under 35 U.S.C. 154(b) by 0 days.

(21) Appl. No.: 17/851,160

(22) Filed: Jun. 28, 2022

(51) Int. Cl.
*H03L 7/083* (2006.01)
*G06F 1/12* (2006.01)
*H03L 7/18* (2006.01)

(52) U.S. Cl.
CPC ............... *H03L 7/083* (2013.01); *G06F 1/12* (2013.01); *H03L 7/1803* (2013.01)

(58) Field of Classification Search
CPC ............ H03K 5/135; H03K 5/26; H03K 2005/00286; H03K 5/01; G06F 1/10; G06F 1/12; G06F 1/08; G06F 13/1689; G06F 1/14; G06F 13/4278; G06F 1/04; H03L 7/07; H03L 7/18; H03L 7/0805; H03L 7/0992; H03L 7/0994; H03L 7/08; H03L 7/081; H03L 7/091; H03L 7/16; H03L 7/185; H04L 7/0012; H04L 7/0037; H04L 7/0008
See application file for complete search history.

(56) References Cited

U.S. PATENT DOCUMENTS

| | | | | |
|---|---|---|---|---|
| 6,037,818 A | * | 3/2000 | Sato | ........................ H03K 5/135 327/272 |
| 6,304,582 B1 | * | 10/2001 | Zhang | .................... H04J 3/0688 375/376 |
| 9,417,655 B2 | * | 8/2016 | Balasubramanian | ..... G06F 1/10 |
| 10,075,156 B2 | | 9/2018 | Manian et al. | |
| 10,367,511 B2 | | 7/2019 | Dusad et al. | |

(Continued)

OTHER PUBLICATIONS

"Implementing JESD204B SYSREF and Achieving Deterministic Latency with ADC32RF45", Texas Instruments, Application Report, SBAA221—May 2016.

*Primary Examiner* — John W Poos
(74) *Attorney, Agent, or Firm* — Law Office of Gerald Maliszewski; Gerald Maliszewski

(57) ABSTRACT

Described herein are a method and apparatus for a selective SYSREF (SYStem REFerence signal) scheme that is driven by an external SYSREF source for a system that may include, for example, analog blocks, such as analog-to-digital converters (ADCs), digital-to-analog converters (DACs), radio frequency (RF) arrays, as well as digital blocks, which may include JESD serializer/deserializer (SERDES) Transport and Link Layer circuitry, all of which can be operating at different clock frequencies. In one aspect, synchronization of the components is achieved when an internal SYSREF for the analog blocks is keyed off the external SYSREF, but the internal SYSREF pulse used by the digital blocks is programmatically keyed off one of the periodic internal SYSREF pulses. Additionally, a mechanism is provided for synchronization of the programmatically selected internal SYSREF across different clock domains in the digital blocks.

21 Claims, 12 Drawing Sheets

(56) References Cited

U.S. PATENT DOCUMENTS

| | | | | |
|---|---|---|---|---|
| 2002/0175724 A1* | 11/2002 | Cyrusian | ............... | H03K 5/135 327/172 |
| 2005/0001663 A1* | 1/2005 | Lee | ............... | H03L 7/093 327/158 |
| 2005/0122796 A1* | 6/2005 | Jung | ............... | G11C 7/222 365/194 |
| 2005/0195004 A1* | 9/2005 | Kim | ............... | H03L 7/10 327/158 |
| 2009/0189700 A1* | 7/2009 | Kuroda | ............... | H03L 7/185 331/16 |
| 2010/0091925 A1* | 4/2010 | Nedovic | ............... | H04L 7/033 375/359 |

* cited by examiner

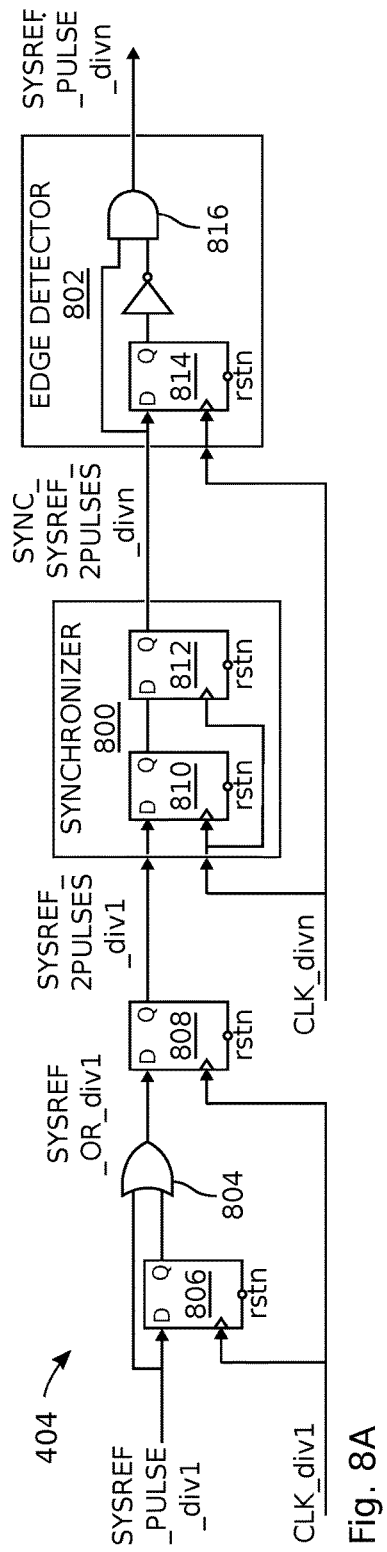
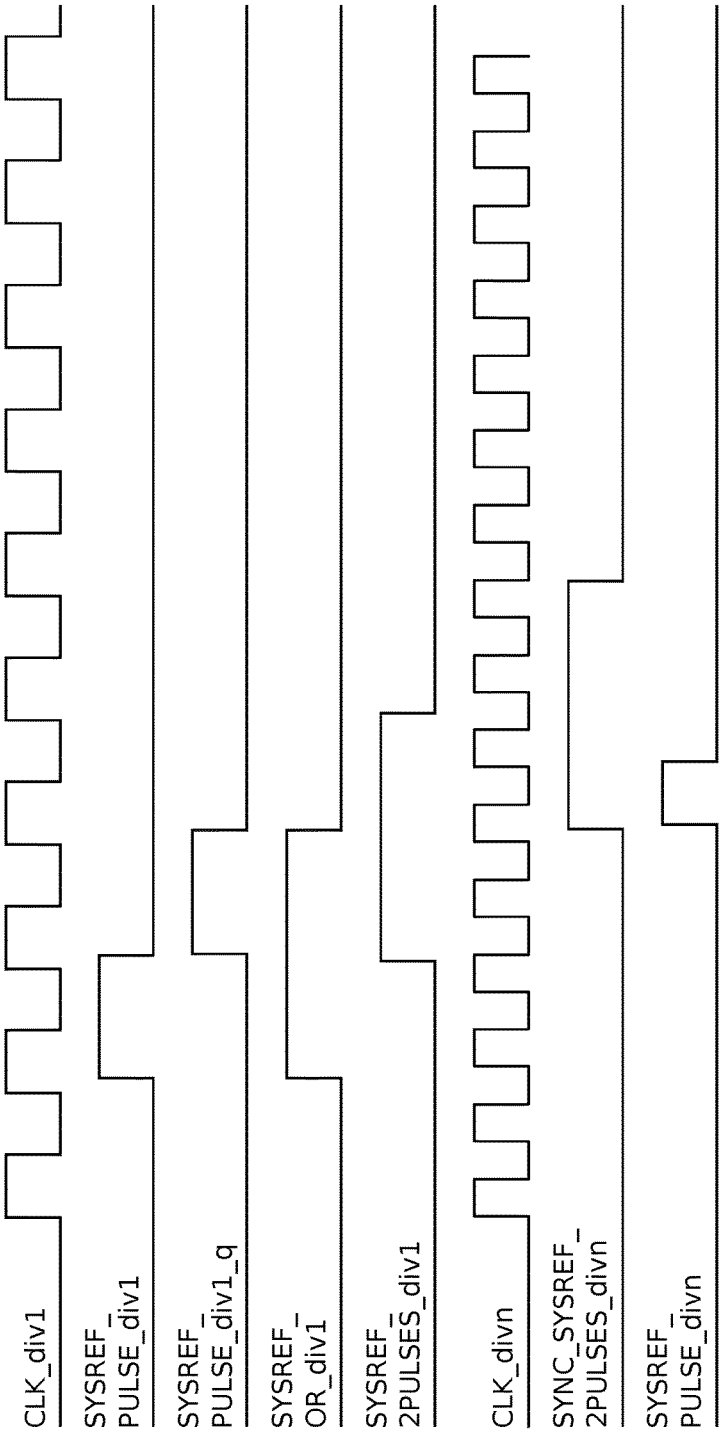
Fig. 8A
Fig. 8B

SYSTEM REFERENCE (SYSREF) SIGNAL SYSTEM AND METHOD

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to SYStem REFerence (SYSREF) signaling and, more particularly, to a system and method for establishing circuit synchronization based upon an externally supplied SYSREF signal.

2. Description of the Related Art

As currently implemented in the JESD204B/204C specification, SYStem REFreference (SYSREF) is essentially a one-shot (strobe-type) or "gapped" periodic signal that acts as a master timing reference to align the boundaries of local clocks in JESD204B(C) Subclass 1 devices, including all internal clocks, internal clock dividers, as well as local multiframe clocks (LMFCs) in each transmitter and receiver. SYSREF must be source synchronous with the device clock. Alignment by the SYSREF signal helps to ensure deterministic latency throughout the system.

FIG. 11 is a timing diagram depicting periodic and gapped periodic SYSREF signals (prior art). According to the JESD204B(C) standard SYSREF can be a one-shot, gapped periodic or a periodic signal. In the case of periodic or gapped periodic, the SYSREF period must be an integer multiple of the Local Multi Frame Clock (LMFC) period in order to prevent the SYSREF pulse appearing in the middle of a multiframe. Gapped periodic means SYSREF pulses may be "missing" (as shown in phantom) at periodic time intervals, but the time interval between SYSREF pulses is always an integer multiple of the SYSREF period.

Synchronization across multiple transmitter/receiver (TX/RX) devices is achieved by having phase aligned device clocks across all the devices and making the SYSREF signal synchronous to the device clocks. The internal frame and LMFC clocks within each TX/RX device must be aligned to that edge (rising or falling) of the device clock where SYSREF is sampled HIGH, and this, in turn, also aligns the internal clocks of all the devices (TX or RX) with each other. In other words, the synchronization is achieved by generating the frame and LMFC clocks in both the TX and RX as governed by events that occur at the same time instant, i.e., when SYSREF has a 0 to 1 transition. The SYSREF should also meet the setup and hold time of the device clock, and must be distributed to each TX/RX with matched trace lengths and signal type relative to the device clock.

FIG. 12 is a timing diagram depicting the distribution of a device clock to internal clocks (prior art). In JESD204B (C), a common device clock (Dev Clk) may be distributed to analog-to-digital data converts (ADCs) and digital-to-analog data converters (DACs), and used to generate internal clocks. A resulting phase mismatch of the divided-down clocks (Internal Clock Converter A and B) may cause great uncertainty in the link latency. Further, there are often data converters in a JESD system working in different clock domains. In addition, the data converters are subject to process/temperature/voltage (PTV) and multiple link reestablishments that cause the latency between the transmitter and receiver to vary from one power-up of the system (through power-down) to the next power-up. Thus it can be seen that the SYSREF signal is a very critical signal for data converters with a JESD204B(C) interface and a clear, fundamental, and deep understanding of SYSREF is imperative for application and design engineers. One major problem in using SYSREF is that for very high speed device clocks, it may not be possible to meet the SYSREF setup/hold time requirements relative to the device clock.

It would be advantageous if the SYSREF pulse synchronization with system internal clocks could be constantly maintained, permitting some components to be reset immediately, and other components to be reset multiple periods later.

SUMMARY OF THE INVENTION

Described herein are a method and apparatus for a selective SYSREF (SYStem REFerence signal) scheme that is driven by an external SYSREF source for a system that may include, for example, analog blocks, such as analog-to-digital converters (ADCs), digital-to-analog converters (DACs), radio frequency (RF) arrays, as well as digital blocks, which may include JESD serializer/deserializer (SERDES) transport and link layer circuitry, all of which can be operating at different clock frequencies. In one aspect, synchronization of the components is achieved when an internal SYSREF for the analog blocks is keyed off the external SYSREF, but the internal SYSREF pulse used by the digital blocks is programmatically keyed off one of the periodic internal SYSREF pulses. Additionally, a mechanism is provided for synchronization of the programmatically selected internal SYSREF across different clock domains in the digital blocks.

Upon power-up, the initial external SYSREF pulse supplied to the system may not be stable due to the initial power instabilities. Therefore, the scheme described herein permits the digital blocks to programmatically delay using the internal SYSREF (that is derived from the external SYSREF) until after the external SYSREF is stable. In addition, the scheme gives each digital block the flexibility to use either one internal SYSREF pulse or a periodic train of internal SYSREF pulses. A periodic internal SYSREF pulse train is used by some digital blocks as triggers to achieve synchronization.

Accordingly, a method is provided for SYSREF signaling. The method accepts a first clock signal (CLK_1) having a first frequency, and a first system reference signal (SYSREF_1) associated with the first clock signal. In one aspect the first clock signal (CLK_1) and first system reference signal (SYSREF_1) may satisfy the requirements of a JESD204B/204C specification. Assuming that there may be non-deterministic delays in the CLK_1 and SYSREF_1 signals, the method supplies a first circuit (e.g., an analog block) with a second clock signal (CLK_2) having the first frequency. The method supplies a periodic second system reference signal (SYSREF_2) having the first frequency, with a SETUP/HOLD delay responsive to the second clock signal. A divider network divides the second clock signal (CLK_2) to supply a third clock signal (CLK_div1) having a third frequency less than the first frequency. The divider network also divides the second system reference signal (SYSREF_2) to supply a periodic third reference signal (SYSREF_div1) having the third frequency. A validity pulse (VALID_SYSREF) is generated in response to receiving a circuit stabilization acknowledgement from the first circuit.

A synchronization network generates a periodic internal SYSREF signal (sysref_posedge_div1) in response to receiving the third clock signal (CLK_div1) and the third reference signal (SYSREF_div1), subsequent to receiving the validity pulse (VALID_SYSREF). The synchronization network supplies the internal SYSREF signal (sysref_posedge_div1) to a second circuit. The internal SYSREF signal (sysref_posedge_div1) is synchronous with the second system reference signal (SYSREF_2).

In one aspect, the second circuit is a local multiframe clock (LMFC) network, and the method, subsequent to a first predetermined number of initial internal SYSREF signal (sysref_posedge_div1) pulses, supplies a periodic fourth reference signal (SYSREF_PULSE_div1) synchronized with the internal SYSREF signal (sysref_posedge_div1), as well as a periodic local multiframe clock signal (LMFC_div1), synchronized with the internal SYSREF signal, having a periodicity of (K·F), where:

K=the number of frames in a multiframe; and,
F=the number of octets in a frame.

In other aspects, in response to accepting the third clock signal (CLK_div1) and the third reference signal (SYSREF_div1), a SYSREF monitor supplies a monitor signal verifying that the third reference signal (SYSREF_div1) has a constant period, regardless of the validity pulse (VALID_SYSREF) state.

In one aspect, a reset synchronizer supplies a reset signal (sync_rstn) in response to the occurrence of every third clock signal (CLK_div1) pulse. The synchronizer network, LMFC network, and the system monitor are reset after the receipt of each reset signal.

The divider network may also supply an nth clock signal (CLK_divn) having a fourth frequency less than the first frequency and greater than the third frequency. A transport layer pulse stretcher receives the fourth reference signal (SYSREF_PULSE_div1) and the third clock signal (CLK_div1), and supplies a periodic fifth reference signal (sysref_2pulses_div1) having the third frequency, with a pulse width wider than the fourth reference signal (SYSREF_PULSE_div1). A transport layer pulse converter receives the fifth reference signal (sysref_2pulses_div1) and the nth clock signal (CLK_divn), and supplies a periodic sixth reference signal (SYSREF_PULSE_divn) having the fourth frequency. The sixth reference signal (SYSREF_PULSE_divn) is synchronous with the second reference signal (SYSREF_2). Link layer circuitry may accept the nth clock signal (CLK_divn) and the sixth reference signal (SYSREF_PULSE_divn).

Additional details of the above-described method and a system for SYSREF signal synchronization are provided below.

BRIEF DESCRIPTION OF THE DRAWINGS

FIGS. 8A and 8B are, respectively, a schematic block diagram depicting BLOCK3 in greater detail, and a timing diagram.

DETAILED DESCRIPTION

Figure 1:
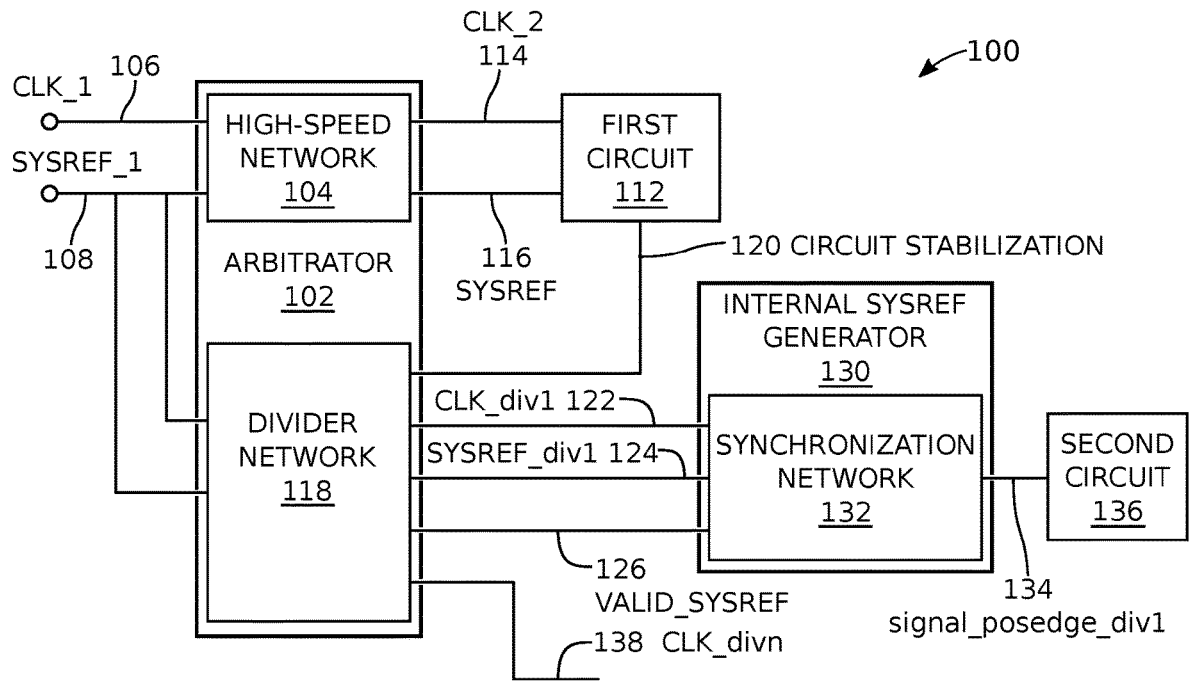
FIG. 1 is a schematic block diagram of a SYStem REFerence (SYSREF) signal system.
Figure 11:
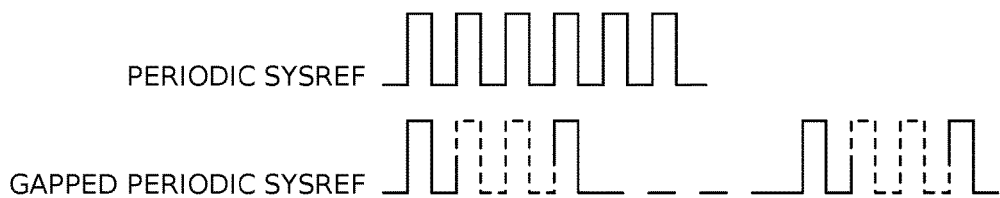
FIG. 11 is a timing diagram depicting periodic and gapped periodic SYSREF signals (prior art).
Figure 12:
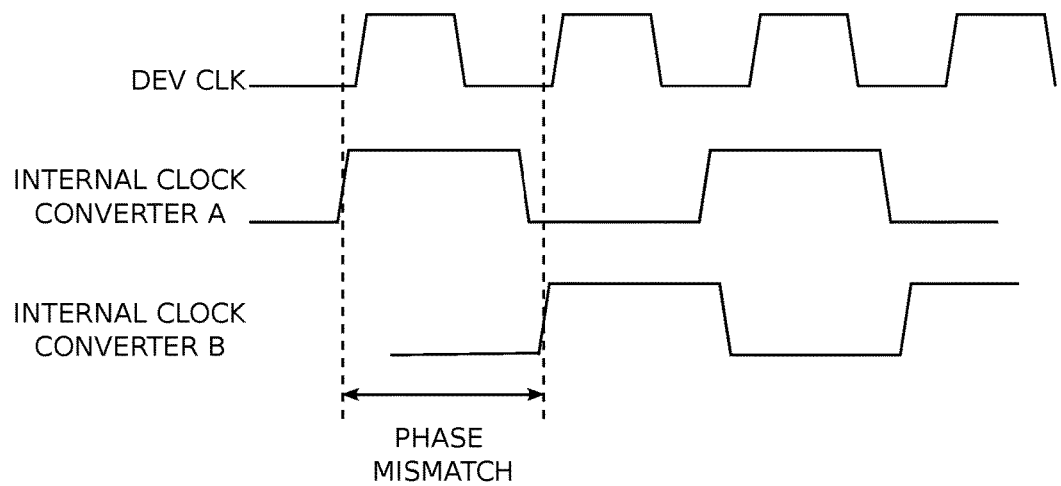
FIG. 12 is a timing diagram depicting the distribution of a device clock to internal clocks (prior art).

FIG. 1 is a schematic block diagram of a SYStem REFerence (SYSREF) signal system. The system 100 comprises an arbitrator 102 that in turn comprises a high-speed network 104. The high-speed network 104 has an input interface on line 106 to accept a first clock signal (CLK_1) having a first frequency, and a first system reference signal (SYSREF_1) on line 108 associated with the first clock signal. In one aspect, the first clock signal (CLK_1) and first system reference signal (SYSREF_1) are responsive to the external clock and SYSREF signals satisfying the requirements of a JESD204B/204C specification, as explained in greater detail in the description of FIG. 4, below. An output interface on line 110 supplies a first circuit 112 with a second clock signal (CLK_2) on line 114 having the first frequency, and a periodic second system reference signal (SYSREF_2) on line 116 having the first frequency, after a SETUP/HOLD delay responsive to the second clock signal. In one aspect, the first circuit is an analog circuit.

The arbitrator 102 further comprises a divider network 118 comprising an input interface on line 106 to accept the first clock signal (CLK_1), the first system reference signal (SYSREF_1) on line 108, and a first circuit stabilization acknowledgement 120. The divider network 118 has an output interface to supply a third clock signal (CLK_div1) on line 122 having a third frequency less than the first frequency and a periodic third reference signal (SYSREF_div1) on line 124 having the third frequency. A validity pulse (VALID_SYSREF) on line 126 is supplied after receiving a circuit stabilization acknowledgement on line 128 from the first circuit 112.

The system 100 further comprises an internal SYSREF generator 130 comprising a synchronization network 132. The synchronization network 132 has an input interface to accept the validity pulse (VALID_SYSREF) on line 126, the third clock signal (CLK_div1) on line 122, and the third reference signal (SYSREF_div1) on line 124. The internal SYSREF generator 130 has an output interface on line 134 to supply a periodic internal SYSREF signal (sysref_posedge_div1) to a second circuit. The internal SYSREF signal (sysref_posedge_div1) on line 134 is synchronous with the second system reference signal (SYSREF_2) on line 116.

Figure 2:
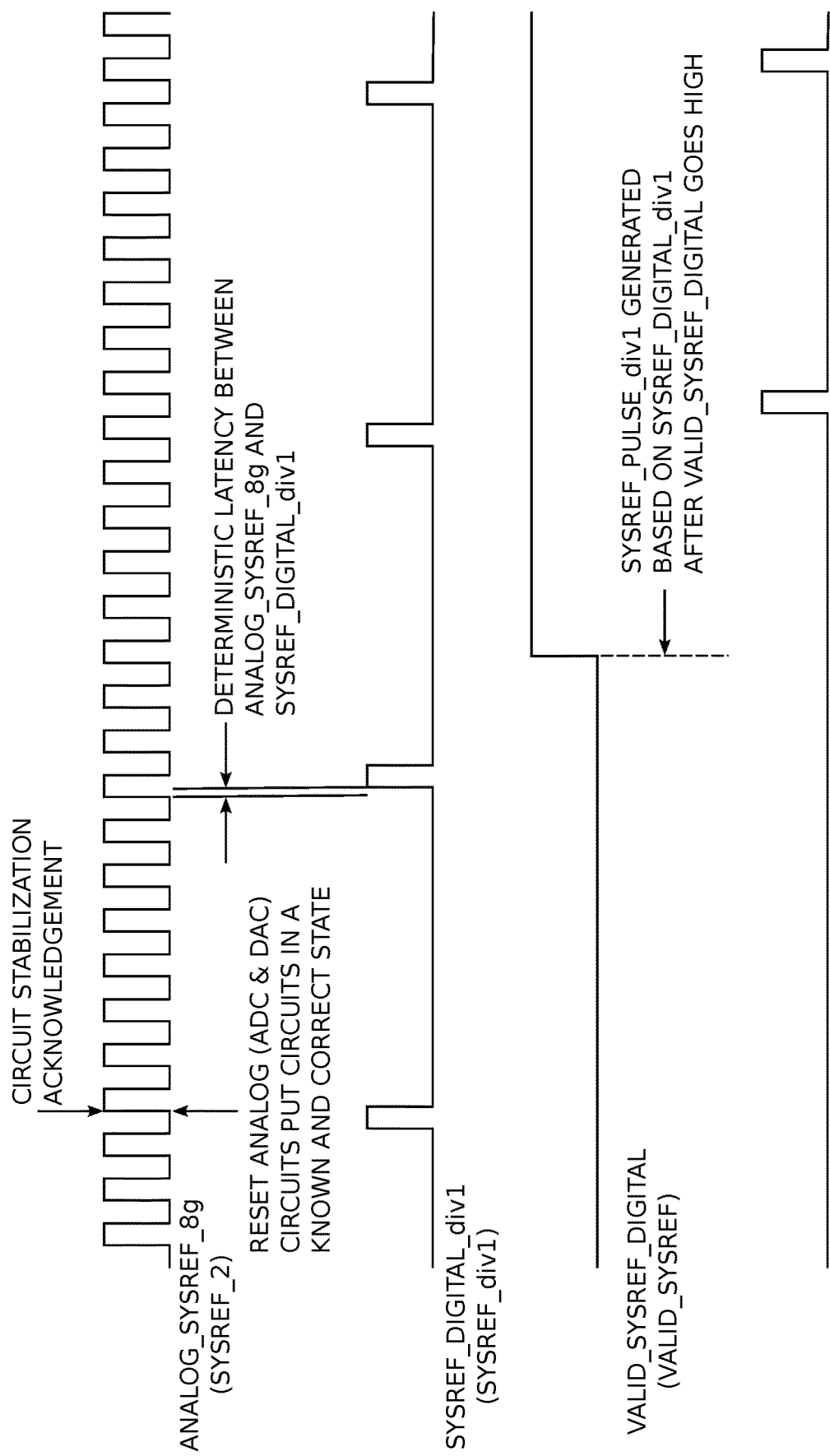
FIG. 2 is an exemplary timing diagram depicting some of the signals described in the explanation of FIG. 1.

FIG. 2 is an exemplary timing diagram depicting some of the signals described in the explanation of FIG. 1. In this example, the third frequency is derived from the first frequency by dividing by eight.

Figure 3:
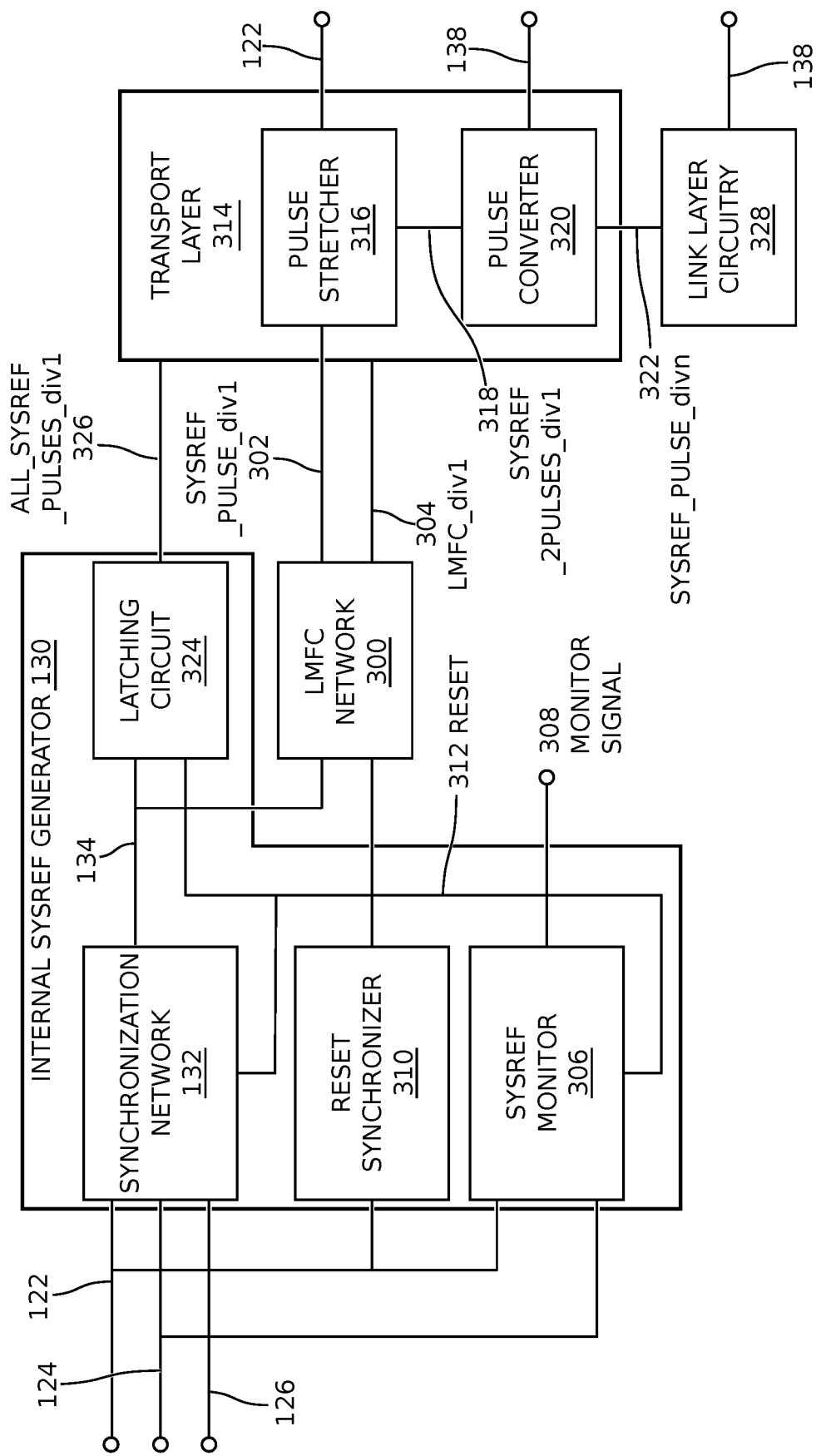
FIG. 3 is a schematic block diagram depicting additional components of the system presented in FIG. 1.

FIG. 3 is a schematic block diagram depicting additional components of the system presented in FIG. 1. In one aspect, the second circuit is a local multiframe clock (LMFC) network 300 comprising an input interface on line 134 to accept the internal SYSREF signal (sysref_posedge_div1). An output interface supplies, subsequent to a first predetermined number of initial internal SYSREF signal pulses, a periodic fourth reference signal (SYSREF_PULSE_div1) on line 302 synchronized with the internal SYSREF signal (sysref_posedge_div1), see FIG. 2. The output interface also supplies a periodic local multiframe clock signal (LMFC_div1) on line 304, synchronized with the internal SYSREF signal, having a periodicity of (K·F), where:

K=the number of frames in a multiframe; and,
F=the number of octets in a frame.

The internal SYSREF generator 130 may further comprise a sysref monitor 306. The sysref monitor 306 has an input interface to accept the third clock signal (CLK_div1) on line 122 and the third reference signal (SYSREF_div1) on line 124. An output interface supplies a monitor signal verifying that the third reference signal (SYSREF_div1) has a constant period, regardless of the validity pulse (VALID_SYSREF) state. Additional details of the sysref monitor are provided below in the explanations accompanying FIGS. 9A-9H.

The internal SYSREF generator 130 may further comprise a reset synchronizer 310 with an input interface on line 122 to receive the third clock signal (CLK_div1). An output interface on line 312 supplies a reset signal (sync_rstn) in response to every occurrence of the third clock signal (CLK_div1). The synchronizer network 132, LMFC network 300, and the system monitor 306 each have an input interface on line 312 to receive the reset signal (sync_rstn), and are reset after the receipt of each reset signal.

As shown in FIG. 1, in some aspects the divider network further comprises an output interface to supply an nth clock signal (CLK_divn) on line 138 having a fourth frequency less than the first frequency and greater than the third frequency, where n is an integer greater than 1. Returning to FIG. 3, the system 100 may further comprise transport layer circuitry 314 with a pulse stretcher 316 having an input interface on line 302 to receive the fourth reference signal (SYSREF_PULSE_div1) and the third clock signal (CLK_div1) on line 122. An output interface on line 318 supplies a periodic fifth reference signal (sysref_2pulses_div1) having the third frequency, with a pulse width wider than the fourth reference signal (SYSREF_PULSE_div1). A pulse converter 320 has an input interface to receive the fifth reference signal (sysref_2pulses_div1) on line 318 and the nth clock signal (CLK_divn) on line 138. The pulse converter 320 has an output interface on line 322 to supply a periodic sixth reference signal (SYSREF_PULSE_divn) having the fourth frequency. The sixth reference signal (SYSREF_PULSE_divn) is synchronous with the second reference signal (SYSREF_2).

In one other aspect the internal SYSREF generator 130 further comprises a latching circuit 324 having an input interface to accept the internal SYSREF signal (sysref_posedge_div1) on line 134 and the second reset signal (sync_rstn) on line 312. The latching circuit 324 has an output on line 326 to supply a periodic seventh reference signal (ALL_SYSREF_PULSES_div1). The transport layer circuitry 314 has an input interface to accept the seventh reference signal (ALL_SYSREF_PULSES_div1) on line 326 and the local multiframe clock signal (LMFC_div1) on line 304.

In one aspect, the system further comprises link layer circuitry 328 having an input interface to accept the nth clock signal (CLK_divn) on line 138 and the sixth reference signal (SYSREF_PULSE_divn) on line 322.

The system described above guarantees deterministic latency in applications where system synchronization is required. As used herein, "deterministic latency" is a fixed delay that results from the (fixed) delay through hardware components. The system has application where SYSREF is used to synchronize several electronic components in the system (e.g., a chip), where each component may be operating at different clock frequencies. SYSREF (i.e., SYSREF_div1) is aligned to the device clock (i.e., CLK_div1) with a pre-configured frequency that is used to control the multiple components in the system. The SYSREF signal may be implemented, for example, to satisfy the requirements of the JESD204B/204C specification for serialized interfaces.

In some implementations, the system may be made up of ADCs (analog-to-digital converters) which convert analog signals to digital values, DACs (digital-to-analog converters) which execute the reverse operation—converting digital values to analog signals, radio frequency (RF) arrays, which may send analog signals to the ADCs and receive analog signals from the DACs, and JESD204B/204C serial links (e.g., digital transport and link layer blocks). For example, these analog circuits may use the SYSREF_2 and CLK_2 signals described above, while the serial links may use signals derived from sysref_posedge_div1.

The system guarantees a fixed deterministic latency in the system relative to the SYSREF sent to the ADCs/DACs, RF arrays, and the JESD204B/204C digital transport and link layer blocks. The deterministic latency enables all the blocks to be synchronized relative to SYSREF. The synchronization is essential for applications such as phased array radar. In other words, the system guarantees synchronization by ensuring that the analog SYSREF (e.g., SYSREF_2) sent to the ADCs/DACs/RF arrays is aligned to the digital SYSREF (e.g. SYSREF_PULSE_div1 and SYSREF_PULSE_divn) sent to the digital blocks. Alternatively stated, the overall system must distribute SYSREF to the analog, RF, and digital blocks. A conventional 1-shot (i.e., non-periodic) SYSREF would require that all the various blocks be ready at the same time immediately after receiving the SYSREF pulse. However, a periodic SYSREF allows for an earlier SYSREF to be used to reset the analog blocks for instance, while a later SYSREF (that is a known multiple of periods away) can be used by the digital blocks. A non-periodic SYSREF is too limited because it is too rigid, while a periodic SYSREF allows for more flexibility.

Figure 4:
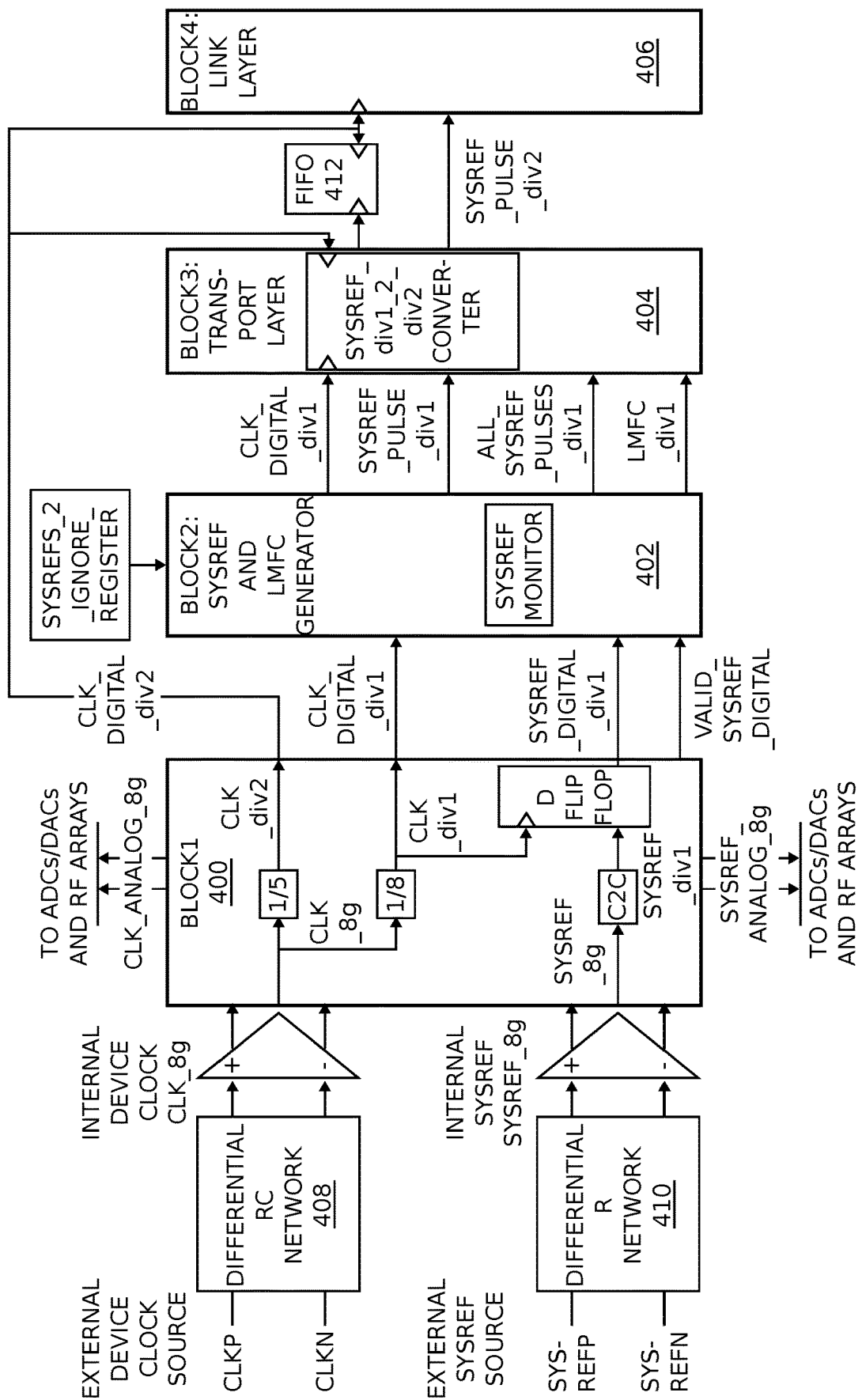
FIG. 4 is the overall schematic block diagram depicting an exemplary application.

FIG. 4 is the overall schematic block diagram depicting an exemplary application. The system consists of four main blocks: BLOCK1, BLOCK2, BLOCK3, and BLOCK4. With reference to FIGS. 1 and 3, BLOCK1 400 is equivalent to the arbitrator, which includes the high-speed and divider networks. The divider network includes a C2C (clock-to-clock) block that converts the input clock to the output clock by clock division. BLOCK2 402 is equivalent to internal SYSREF generator, LMFC network, and latching circuit of FIG. 3. BLOCK3 404 is the JESD204B/204C transport layer block and BLOCK4 406 is the JESD204B/204C link layer block.

Figure 5:
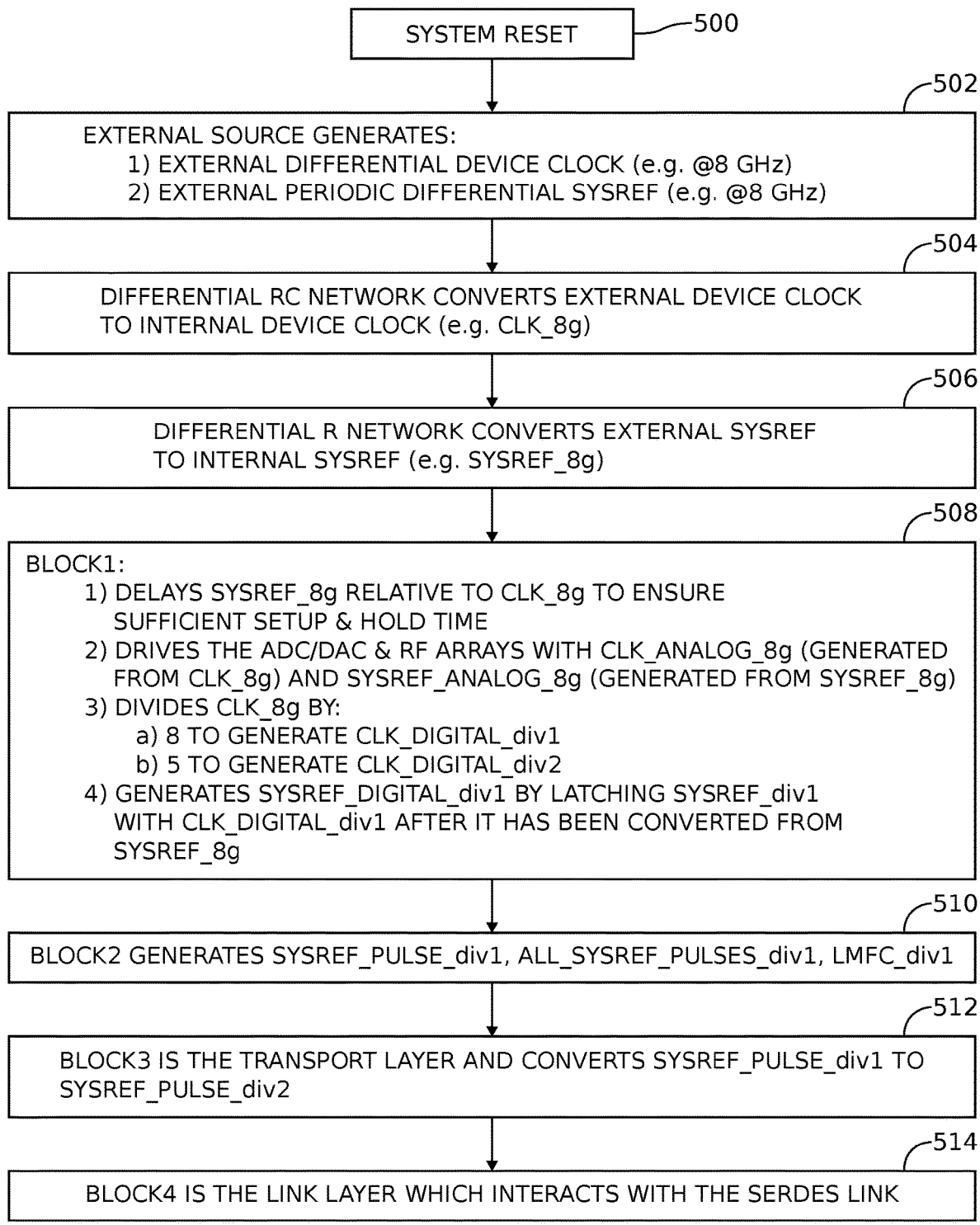
FIG. 5 is a system flowchart illustrating a top-level view of the system.

FIG. 5 is a system flowchart illustrating a top-level view of the system. After system reset (Step 500), an external source generates a differential device clock with a pre-configured frequency, which in this example is 8 gigahertz (GHz), hereinafter referred to as CLK_8g, and a differential periodic SYSREF at the 8 GHz clock rate, hereinafter referred to as SYSREF_8g (Step 502). The differential resistor/capacitor (RC) network (408, FIG. 4) converts the external device clock to an Internal Device Clock (e.g.

CLK_8g) in Step 504, while the differential resistor (R) Network 410 converts the external SYSREF to an internal SYSREF (e.g. SYSREF_8g) in Step 506. By the time CLK_8g and SYSREF_8g arrive at BLOCK1, the alignment may have been destroyed since both signals have different delay paths from the external input ports to BLOCK1. Therefore, a delay is needed to re-establish the alignment between CLK_8g and SYSREF_8g. For any input into a flip-flop to be latched reliably by the corresponding clock, the input data has to be steady for a minimum duration before the clock rising edge (SETUP time) and be steady for a minimum duration after the clock rising edge (HOLD time).

Step 508 performs multiple functions. After tuning the delay between SYSREF_8g and CLK_8g to ensure a sufficient SETUP/HOLD time margin for SYSREF_8g relative to CLK_8g, BLOCK1 sends the tuned SYSREF and clock (referred to as CLK_ANALOG_8g and SYSREF_ANALOG_8g) to the ADCs/DACs and RF arrays. Step 508 also divides CLK_8g by one or more division factors (e.g., 8 and 5 in this example) to generate one or more digital clocks (e.g., CLK_DIGITAL_div1 and CLK_DIGITAL_div2, respectively). BLOCK1 also generates a digital SYSREF (e.g., SYSREF_div1) relative to the slower (higher divider factor) digital clock by converting SYSREF_8g from the CLK_8g domain to the CLK_div1 domain. SYSREF_div1 is then latched with CLK_div1 to produce SYSREF_DIGITAL_div1 sent to BLOCK2. In BLOCK2 the SYSREF_PULSE_div1, ALL_SYSREF_PULSES, and LMFC_div1 signals are generated (Step 512). In Step 514 the necessary signals for the link layer are generated.

Returning to FIG. 2, the deterministic latency between ANALOG_SYSREF_8g and SYSREF_DIGITAL_div1 can be seen, which guarantees the synchronization of all the blocks in the system. After the internal SYSREF_8g and Internal Device Clock, CLK_8g, are stable, the ANALOG blocks (ADCs & DACs) use one of the earliest ANALOG_SYSREF_8g pulses to reset the analog blocks in order to ensure that the analog blocks start from a known and stable state. After the analog blocks are reset, BLOCK1 (the SYSREF Arbitrator) raises VALID_SYSREF_DIGITAL HIGH to notify BLOCK2 (the SYSREF & LMFC GENERATOR) that it can now use subsequent SYSREF_DIGITAL_div1 pulses to generate SYSREF_PULSE_div1.

Figure 6:
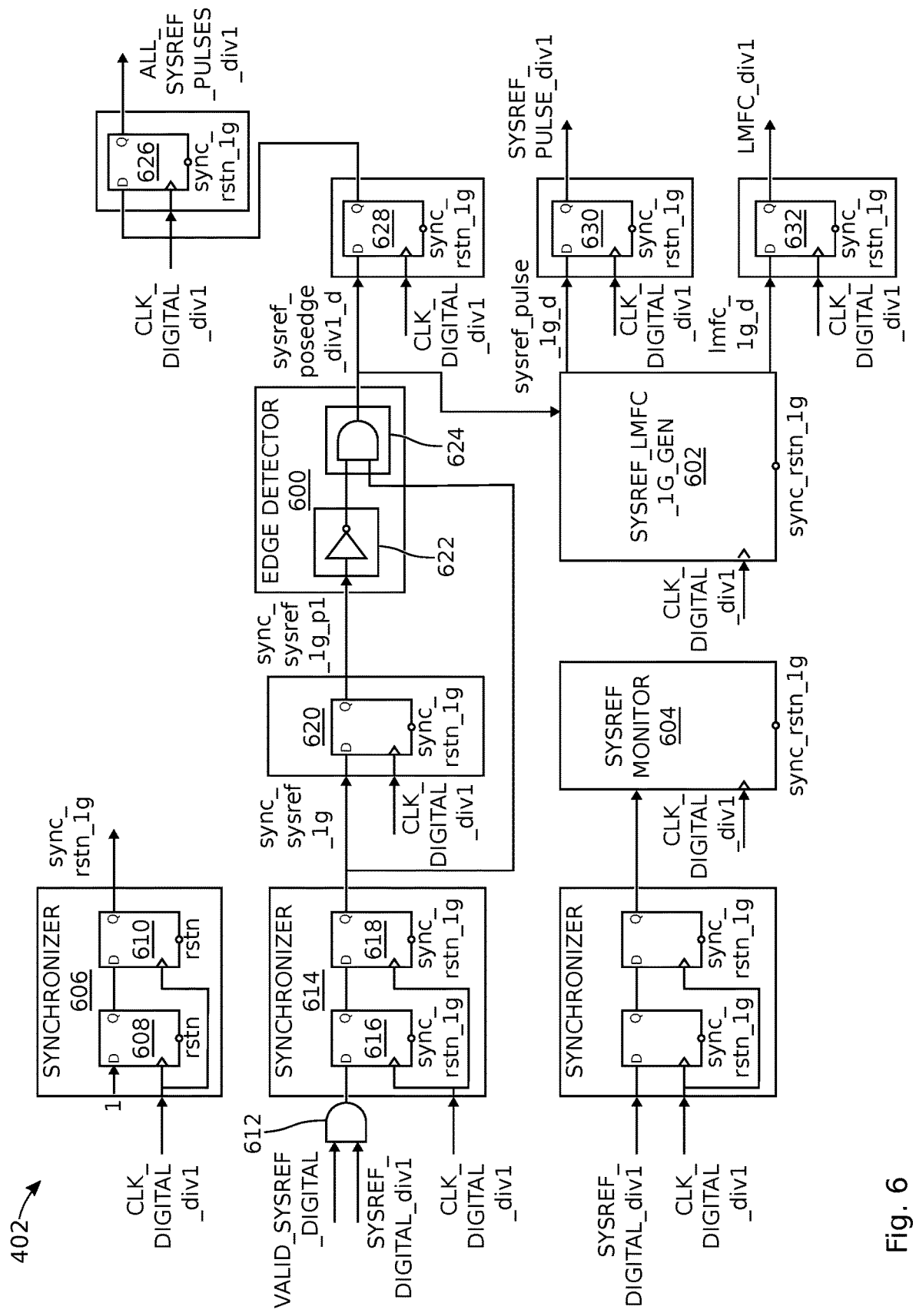
FIG. 6 is a schematic block diagram depicting BLOCK2 in greater detail.

FIG. 6 is a schematic block diagram depicting BLOCK2 in greater detail. As noted above, BLOCK2 402 generates SYSREF_PULSE_div1, ALL_SYSREF_PULSES_div1, and LMFC_div1. Synchronizer 606 creates the sync_rstn_1g signal using D flip-flops 608 and 610. sync_rstn_1g is used as the reset for all the components in BLOCK2. (s)ync_rstn_1g is a synchronized de-metastabilized version of the externally provided hardware reset (rstn) so that each BLOCK2 component has a clean and stable reset. (r)stn is asynchronous to CLK_DIGITAL_div1 used in BLOCK2. Without using synchronizer 606, CLK_DIGITAL_div1 may catch the asynchronous rstn in such a way that the reset to the flip-flops in BLOCK2 occurs on a runt pulse that is not fully developed.

Following AND gate 612, synchronizer 614, with D flip-flops 616, 618, and 620, delivers the signals sync_sysref_1g_pl and sync_sysref_1g to edge detector 600. Using buffer 622 and AND gate 624, the edge detector 600 supplies the signal sysref_posedge_div1_d. Regarding sync_sysref_1g, a synchronizer 614 is needed because VALID_SYSREF_DIGITAL is coming from an asynchronous register bit. The synchronizer 614 that generates sync_sysref_1g, blocks the simple passing through of VALID_SYSREF_DIGITAL signal ANDed with SYSREF_DIGITAL_div1. Therefore, edge detector 600 is needed for generating the sysref_poedge_1g_d, in turn used to generate all the internal SYSREF-related signals. As the name implies, VALID SYSREF DIGITAL indicates when SYSREF_DIGITAL_div1 should be considered to be VALID. Therefore, the edge detector creates sysref_posedge_1d_d when VALID SYSREF DIGITAL is not blocking SYSREF_DIGITAL_div1

D flip-flops 626, 628, 630, and 632 act as latches to supply the signals ALL_SYSREF_PULSES_div1, LMFC_div1, and SYSREF_PULSE_div1. The flip-flops are used to register the outputs of the logic blocks so that the signals are stable from one clock edge to the next.

Figure 7:
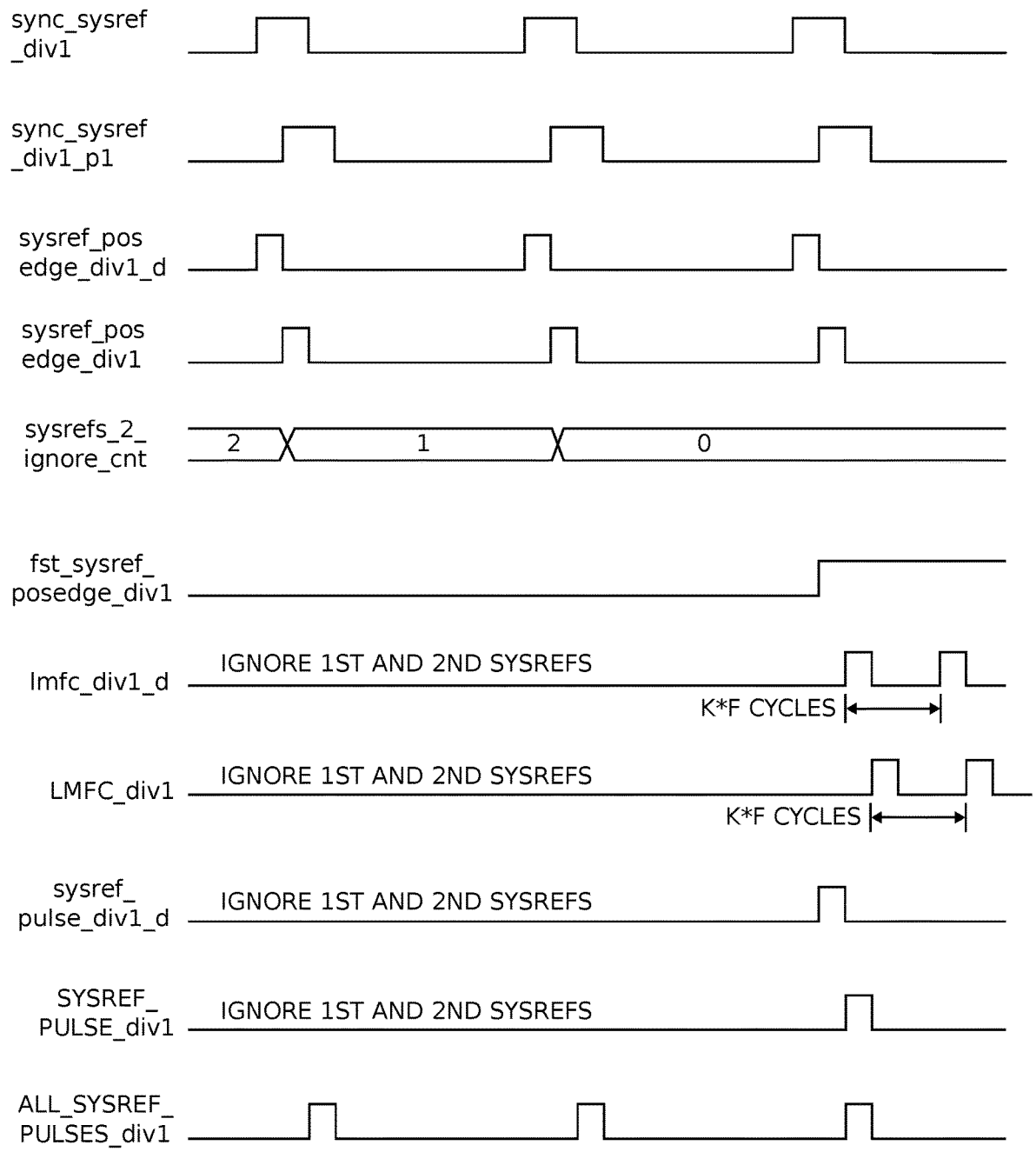
FIG. 7 is a timing diagram depicting the signals associated with BLOCK2.

FIG. 7 is a timing diagram depicting the signals associated with BLOCK2. After VALID_SYREF_DIGITAL goes HIGH, BLOCK2 samples SYSREF_DIGITAL_div1 with CLK_DIGITAL_div1, synchronizes to the CLK_DIGITAL_div1 domain, and generates a pulse, sysref_posedge_div1_d, by using an edge detector (600, FIG. 6). ALL_SYSREF_PULSES_div1 is generated from sysref_posedge_div1_d after 2 pipeline flop delays; therefore, it follows SYSREF_DIGITAL_div1 as long as VALID_SYSREF_DIGITAL is HIGH. ALL_SYSREF_PULSES_div1 is used by the digital blocks that require a periodic train of internal SYSREF pulses for synchronization.

Referencing FIGS. 6 and 7, after the required SYSREFS_2_IGNORE number of SYSREFs have elapsed for all SYSREF_DIGITAL_div1 signals occurring after VALID_SYSREF_DIGITAL goes high, the SYSREF_LMFC_DIV1_GEN 602 generates outputs that are latched to produce SYSREF_PULSE_div1 and periodic LMFC_div1 (local multiframe clock). LMFC_div1 has a periodicity of K·F (the number of frames in a multiframe times the number of octets in a frame) clock cycles. The SYSREF MONITOR 604 validates that the external SYSREF generated by the external source has a constant period by validating that SYSREF_DIGITAL_div1 has a constant period, regardless of the state of VALID_SYSREF_DIGITAL.

FIGS. 8A and 8B are, respectively, a schematic block diagram depicting BLOCK3 in greater detail, and a timing diagram. BLOCK3 404 converts SYSREF_PULSE_div1 (e.g., 1 GHz clock domain, used for instance for the JESD204B/204C transport layer) to SYSREF_PULSE_div2 (e.g., 1.6 GHz clock domain, used for instance for the JESD204B/204C link layer). To ensure that CLK_DIGITAL_div2 samples a non-glitchy stable signal when it is not in transition, SYSREF_PULSE_div1 is first widened to produce sysref_or_div1 by using OR gate 804 and its pipelined version (sysref_div1_q) from D flip-flop 806. To prevent a glitchy signal as an input to the synchronizer 800, sysref_2pulses_div1 is produced by latching sysref_or_div1 with CLK_DIGITAL_div1 using D flip-flop 808. The synchronizer 800 is used to produce a de-metastabilzed version of sysref_2pulses_div1 after it is latched by CLK_DIGITAL_divn using D flip-flops 810 and 812, to convert it from the sysref_2pulses_div1 (in the CLK_div1 clock domain) to sync_sysref_2pulses_divn (in the CLK_divn clock domain). Finally, the edge detector 802 generates SYSREF_PULSE_divn (the SYSREF PULSE in the higher clock domain) by using D flip-flop 814 and AND gate 816, which is the SYSREF_PULSE in the higher clock domain.

CLK_DIGITAL_div1 (e.g., 1 Ghz) is used (for instance) to clock BLOCK3, the JESD204B/204C transport layer. CLK_DIGITAL_div2 (e.g., 1.6 Ghz) is used (for instance)

to clock BLOCK4, the JESD204B/204C link layer. Returning to FIG. 4, the transport (link) layer to link (transport) layer FIFO 412 is used to soak any instantaneous phase difference between CLK_DIGITAL_div1 and CLK_DIGITAL_div2 for the data sent from the transport (link) layer to the link (transport) layer when the system is in the TX (RX) mode.

Additional equivalent instances of BLOCK4 may exist to support additional higher-speed clock frequencies other than CLK_DIGITAL_div2, such as CLK_DIGITAL_div3, CLK_DIGITAL_div4, etc., which would generate a digital SYSREF (SYSREF_PULSE_div3, SYSREF_PULSE_div4, etc. for those clock domains. Any block in the system running at these additional CLK_DIGITAL_div3/CLK_DIGITAL_div4, etc. clock frequencies would use its corresponding SYSREF_PULSE_div3/SYSREF_PULSE_div4, etc. signal for SYSREF synchronization.

Figure 9A:
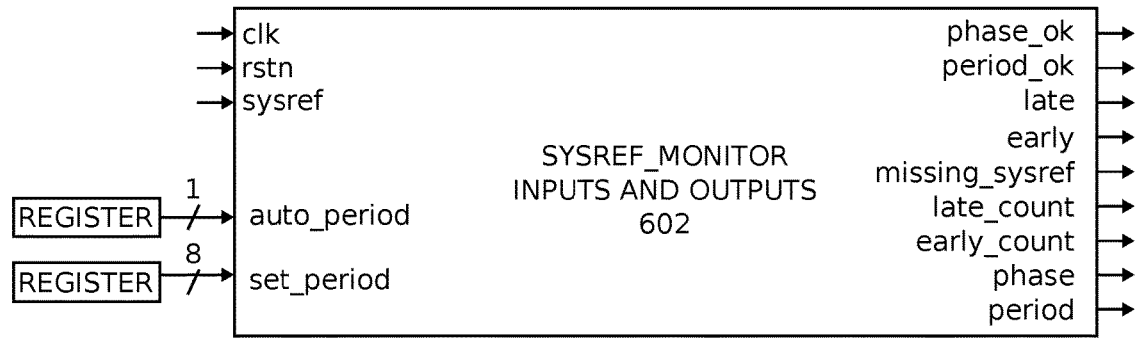
FIGS. 9A through 9H describe the system monitor of FIG. 6 in greater detail.

FIGS. 9A through 9I1 describe the system monitor of FIG. 6 in greater detail. FIG. 9A depicts the input and output signals of the system monitor 602. For the SYSREF input, when compared to the expected period (captured with the set_period input), the sysref monitor issues the following outputs:
  i) phase_ok (the SYSREF phase is OK),
  ii) period_ok (the SYSREF period is OK: the counted SYSREF period=expected period in the set_period REGISTER),
  iii) late (the SYSREF arrived late),
  iv) early (the SYSREF arrived early),
  v) missing_sysref (no SYSREF arrived),
  vi) late count (the number of clock cycles by which the SYSREF is late),
  vii) early count (the number of clock cycles by which SYSREF is early),
  viii) period (the SYSREF period: the number of clk cycles between SYSREF pulses), and,
  ix) phase (the SYSREF phase).

Figure 9B:
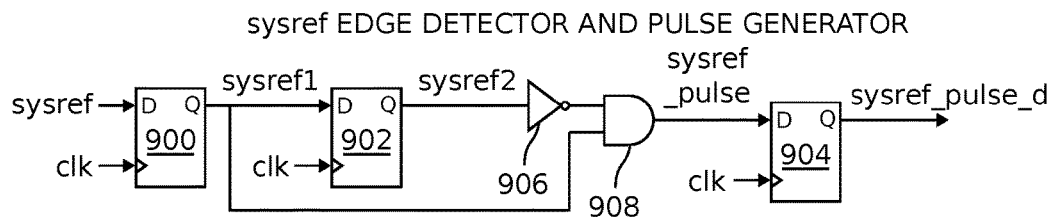

In FIG. 9B D flip-flops 900, 902, and 904, along with inverting buffer 906 and AND gate 908 provide the sysref pulsed signal. Pulse sysref pulsed is generated at the rising edge of SYSREF.

Figure 9C:
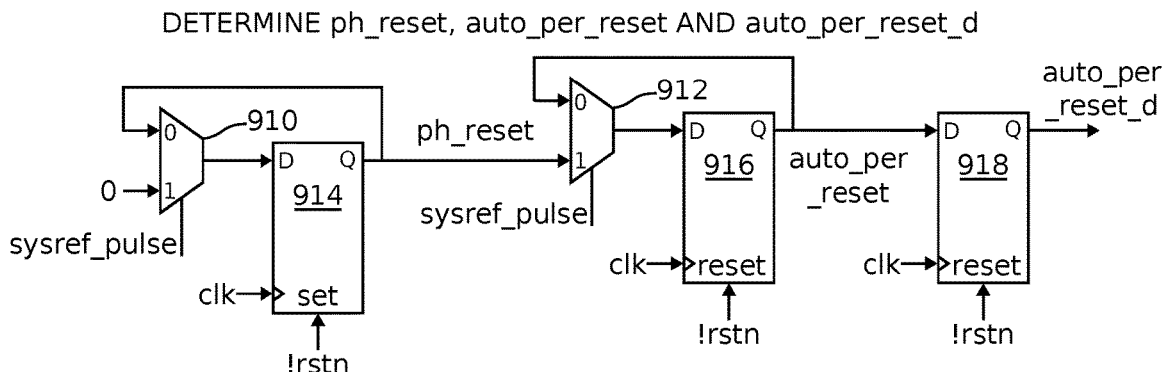

In FIG. 9C comparators 910 and 912, along with D flip-flops 914, 916, and 918 provide the auto_per_reset_d signal. (r)stn resets auto_per_reset_d and auto_per_reset, but sets ph_reset. When rstn is high every SYSREF pulse loads auto_per_reset with ph_reset and resets ph_reset. Every clk pipelines auto_per_reset into auto_per_reset_d. Effectively, the first SYSREF resets ph_reset and sets auto_per_reset (and auto_per_reset_d one clk cycle later). All SYSREFs beyond the first SYSREF do not alter any of the outputs. Basically, this sub-block marks the phase of the first SYSREF with the rising edge of auto_per_reset_d. FIG. 9D is a timing diagram associated with the signals described in FIG. 9C.

Figure 9E:
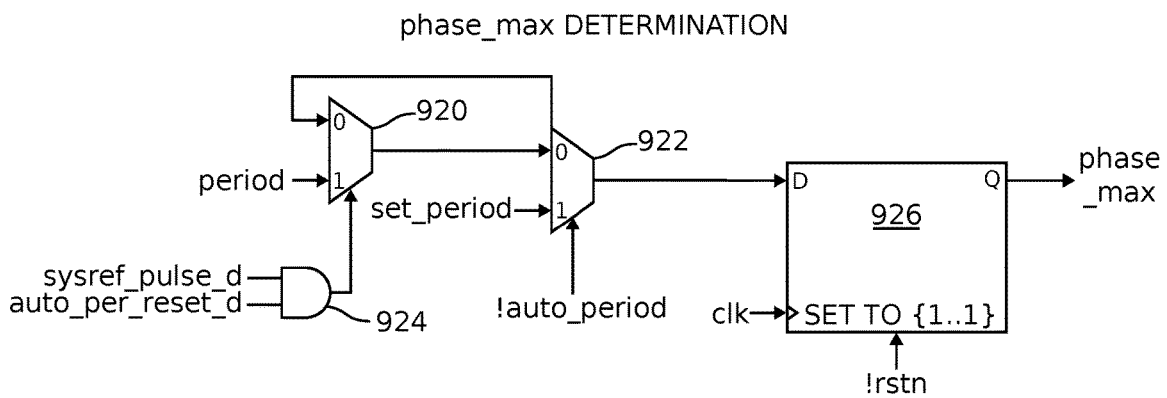
Figure 9D:
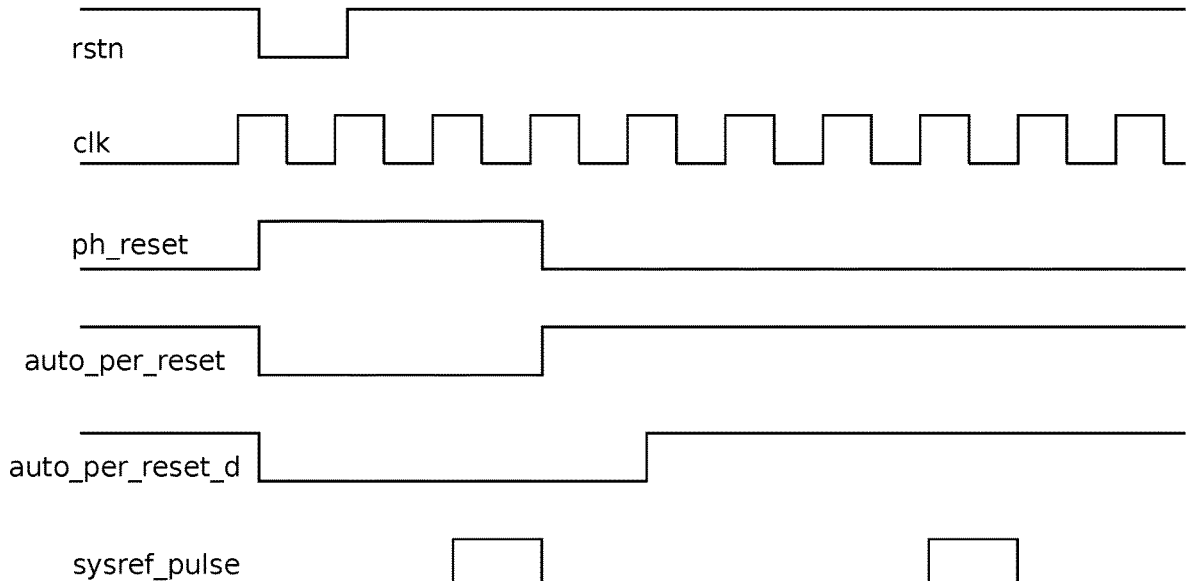
Figure 9H:
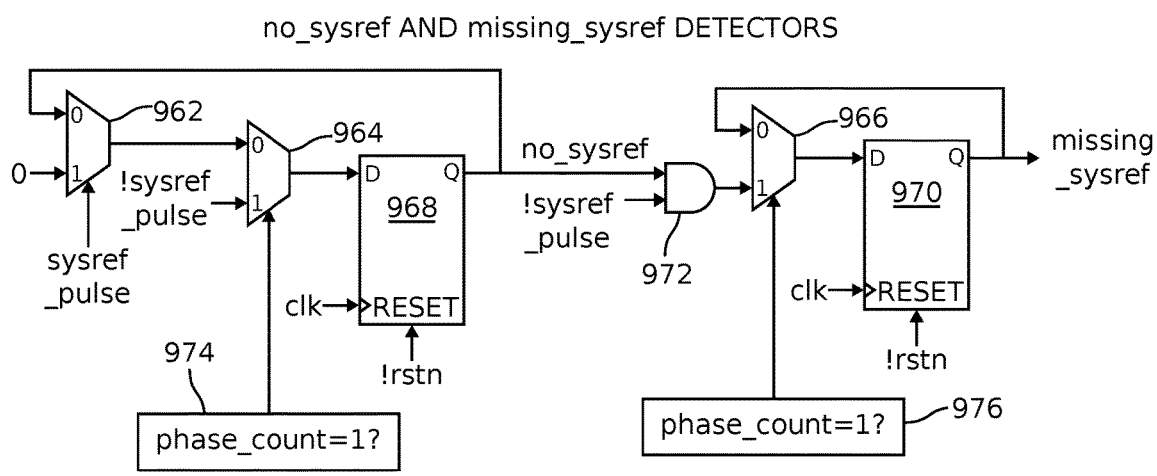

In FIG. 9E, comparators 920 and 922, along with AND gate 924 and D flip-flop 926 provide the phase_max signal. Upon rstn phase_max is set to {11111111}. Thereafter, phase_max is loaded with the counted SYSREF period upon every SYSREF if auto_period=0, otherwise, it is loaded with set_period.

Figure 9F:
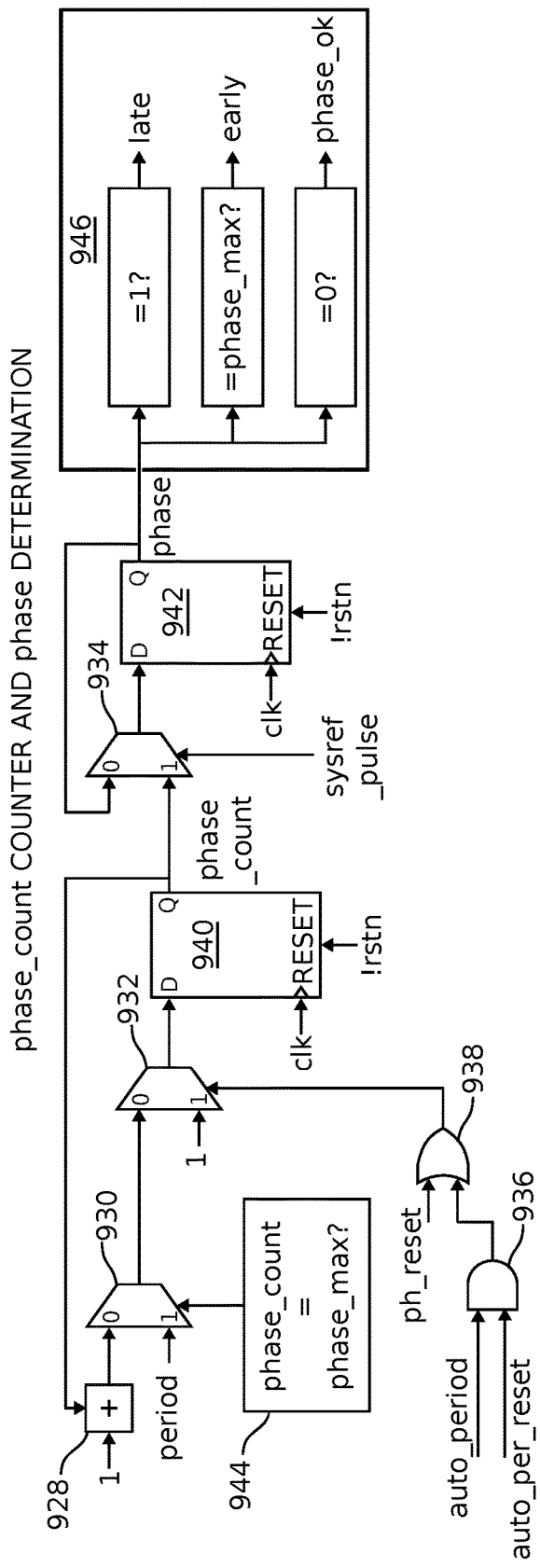

In FIG. 9F, adder 928, comparators 930, 932, and 934, AND gate 936, NOR gate 938, D flip-flops 940 and 942. and logic units 944 and 946 supply the phase_late, phase_early, and phase_ok signals. (p)hase_count is initialized with 1 upon ph_reset OR (auto_period AND auto_per_reset). Therefore, phase_count is incremented every clk cycle until it reaches phase_max, whereby it wraps around to period. The phase is loaded with phase_count every sysref_pulse. The SYSREF is late if the phase=1, early if the phase=phase_max, and phase_ok if phase=0.

Figure 9G:
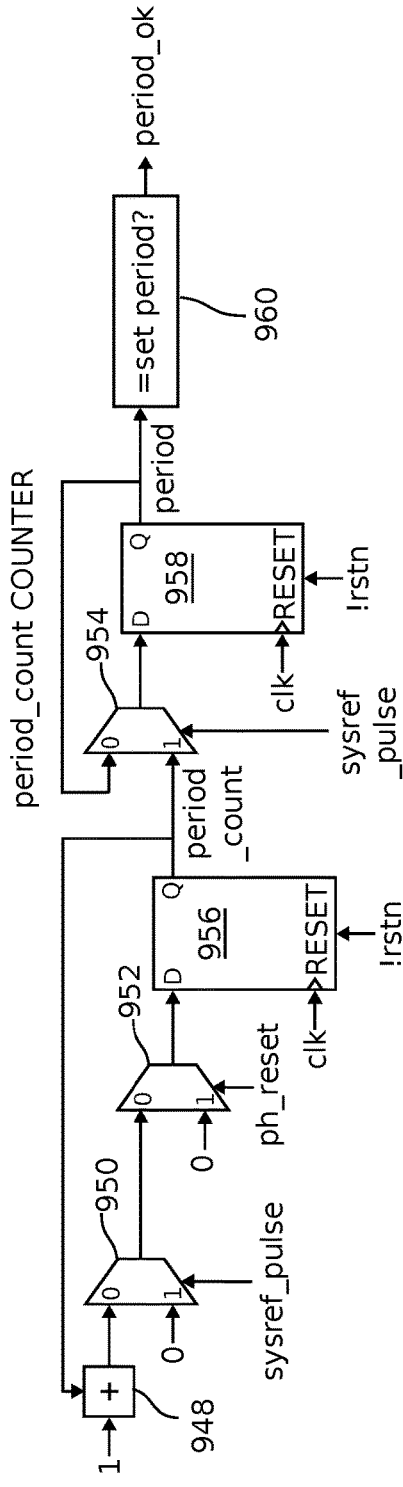

In FIG. 9G, adder 948, comparators 950, 952, and 954, D flip-flops 956 and 958, and logic 960 provide the period_ok signal. This counter counts the number of clk cycles between SYSREFs. The counter can be reset with ph_reset. (p)eriod count is pipelined to period upon every SYSREF. period_ok is SET to 1 if period=the expected period that is loaded into the set_period register 960.

In FIG. 9I1, comparators 962, 964, and 966, D flip-flops 968 and 970, AND gate 972, and logic units 974 and 976 provide the missing_sysref signal. (n)o_sysref is set to 1 at the beginning and is only reset upon the first SYSREF. (n)o_sysref will stay at 1 until the first SYSREF arrives.

Figure 10:
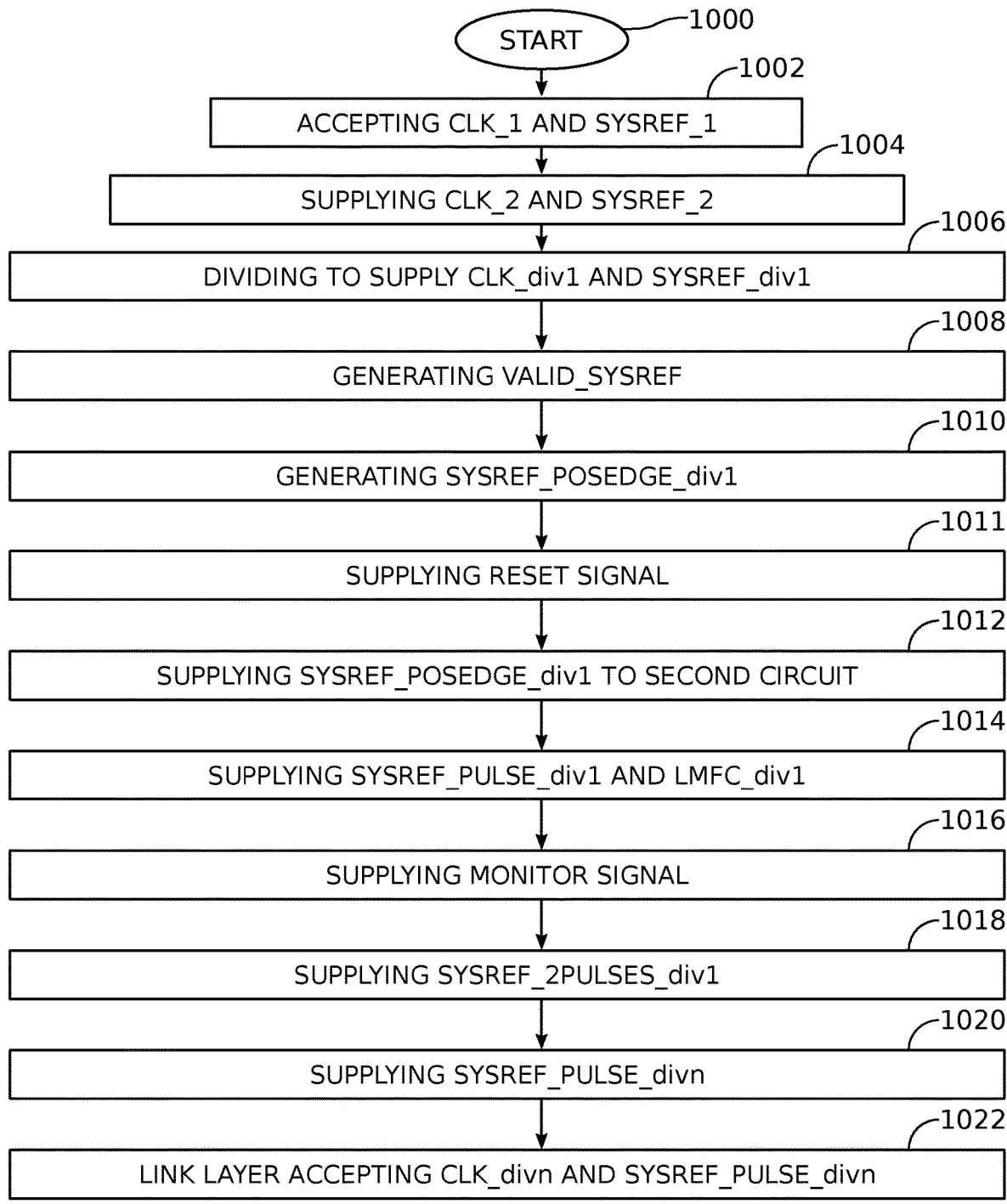
FIG. 10 is a flowchart illustrating a method for SYSREF synchronization.

FIG. 10 is a flowchart illustrating a method for SYSREF synchronization. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps is supported by the explanations describing the figures above. The method starts at Step 1000.

Step 1002 accepts a first clock signal (CLK_1) having a first frequency, and a first system reference signal (SYSREF_1) associated with the first clock signal. In one aspect, the first clock signal (CLK_1) and first system reference signal (SYSREF_1) are responsive to external clock and SYSREF signals that satisfy the requirements of a JESD204B/204C specification. Step 1004 supplies, to a first circuit, a second clock signal (CLK_2) having the first frequency, and a periodic second system reference signal (SYSREF_2) having the first frequency, after a SETUP/HOLD delay responsive to the second clock signal. As noted above, the first circuit may be an analog circuit. In Step 1006 a divider network divides the second clock signal (CLK_2) to supply a third clock signal (CLK_div1) having a third frequency less than the first frequency, and further, divides the second system reference signal (SYSREF_2) to supply a periodic third reference signal (SYSREF_div1) having the third frequency. Step 1008 generates a validity pulse (VALID_SYSREF) in response to receiving a circuit stabilization acknowledgement from the first circuit. In Step 1010 a synchronization network generates a periodic internal SYSREF signal (sysref_posedge_div1) in response to receiving the third clock signal (CLK_div1) and the third reference signal (SYSREF_div1), subsequent to receiving the validity pulse (VALID_SYSREF). In Step 1012 the synchronization network supplies the internal SYSREF signal (sysref_posedge_div1) to a second circuit. The internal SYSREF signal (sysref_posedge_div1) is synchronous with the second system reference signal (SYSREF_2).

In one aspect, supplying the internal SYSREF signal (sysref_posedge_div1) to the second circuit in Step 1012 includes supplying the internal SYSREF signal to a local multiframe clock (LMFC) network. Then, the method includes the following steps. Subsequent to a first predetermined number of initial internal SYSREF signal pulses, Step 1014 supplies a periodic fourth reference signal (SYSREF_PULSE_div1) synchronized with the internal SYSREF signal (sysref_posedge_div1). Step 1014 also supplies a periodic local multiframe clock signal (LMFC_div1), synchronized with the internal SYSREF signal, having a periodicity of (K·F), where:

K=the number of frames in a multiframe; and,
F=the number of octets in a frame.

In one aspect, responsive to accepting the third clock signal (CLK_div1) and the third reference signal (SYSREF_div1), a sysref monitor in Step 1016 supplies a monitor signal verifying that the third reference signal (SYSREF_div1) has a constant period, regardless of the validity pulse (VALID_SYSREF) state.

In another aspect, a reset synchronizer in Step 1011 supplies a reset signal (sync_rstn) in response to every occurrence of the third clock signal (CLK_div1) pulse. As a result, the synchronizer network, LMFC network, and the system monitor are reset after the receipt of each reset signal.

In another aspect, in Step 1006 the divider network supplies an nth clock signal (CLK_divn) having a fourth frequency less than the first frequency and greater than the third frequency. In Step 1018 a transport layer pulse stretcher receives the fourth reference signal (SYSREF_PULSE_div1) and the third clock signal (CLK_div1). Step 1018 then supplies a periodic fifth reference signal (sysref_2pulses_div1) having the third frequency, with a pulse width wider than the fourth reference signal (SYSREF_PULSE_div1). In Step 1020 a transport layer pulse converter receives the fifth reference signal (sysref_2pulses_div1) and the nth clock signal (CLK_divn), and supplies a periodic sixth reference signal (SYSREF_PULSE_divn) having the fourth frequency. The sixth reference signal (SYSREF_PULSE_divn) is synchronous with the second reference signal (SYSREF_2). In Step 1022 link layer circuitry accepts the nth clock signal (CLK_divn) and the sixth reference signal (SYSREF_PULSE_divn).

A system and method have been provided for SYSREF synchronization. Examples of particular message structures and hardware units have been presented to illustrate the invention. However, the invention is not limited to merely these examples. Although the system is typically depicted as comprising hardware units it should be understood that portions of the system may incorporate a processor executing a sequence of instructions. Other variations and embodiments of the invention will occur to those skilled in the art.

We claim:

1. A SYStem REFerence (SYSREF) signal synchronization system comprising:
an arbitrator comprising:
a high-speed network comprising:
an input interface to accept a first clock signal (CLK_1) having a first frequency, and a first system reference signal (SYSREF_1) associated with the first clock signal;
an output interface to supply, to a first circuit, a second clock signal (CLK_2) having the first frequency, and a periodic second system reference signal (SYSREF_2) having the first frequency, after a SETUP/HOLD delay responsive to the second clock signal;
a divider network comprising:
an input interface to accept the first clock signal (CLK_1), the first system reference signal (SYSREF_1), and a first circuit stabilization acknowledgement;
an output interface to supply a third clock signal (CLK_div1) having a third frequency less than the first frequency, a periodic third reference signal (SYSREF_div1) having the third frequency, and a validity pulse (VALID_SYSREF), supplied after receiving the circuit stabilization acknowledgement from the first circuit;
an internal SYSREF generator comprising:
a synchronization network:
an input interface to accept the validity pulse (VALID_SYSREF), the third clock signal (CLK_div1), and the third reference signal (SYSREF_div1); and,
an output interface to supply a periodic internal SYSREF signal (sysref_posedge_div1) to a second circuit.

2. The system of claim 1 wherein the internal SYSREF signal (sysref_posedge_div1) is synchronous with the second system reference signal (SYSREF_2).

3. The system of claim 1 wherein the first clock signal (CLK_1) and first system reference signal (SYSREF_1) are responsive to external clock and SYSREF signals that satisfy the requirements of a JESD204B/204C specification.

4. The system of claim 1 wherein the second circuit is a local multiframe clock (LMFC) network comprising:
an input interface to accept the internal SYSREF signal (sysref_posedge_div1);
an output interface to supply, subsequent to a first predetermined number of initial internal SYSREF signal pulses, a periodic fourth reference signal (SYSREF_PULSE_div1) synchronized with the internal SYSREF signal (sysref_posedge_div1), and a periodic local multiframe clock signal (LMFC_div1), synchronized with the internal SYSREF signal, having a periodicity of (K·F), where:
K=the number of frames in a multiframe; and,
F=the number of octets in a frame.

5. The system of claim 4 wherein the internal SYSREF generator further comprises:
a sysref monitor comprising:
an input interface to accept the third clock signal (CLK_div1) and the third reference signal (SYSREF_div1); and,
an output interface to supply a monitor signal verifying that the third reference signal (SYSREF_div1) has a constant period, regardless of the validity pulse (VALID_SYSREF) state.

6. The system of claim 5 wherein the synchronization generator further comprises:
a reset synchronizer comprising:
an input interface to receive the third clock signal (CLK_div1);
an output interface to supply a reset signal (sync_rstn) in response to every occurrence of the third clock signal (CLK_div1) pulse;
wherein the synchronizer network, LMFC network, and the system monitor each have an input interface to receive the reset signal (sync_rstn), and are reset after the receipt of each reset signal.

7. The system of claim 4 wherein the divider network further comprises an output interface to supply an nth clock signal (CLK_divn) having a fourth frequency less than the first frequency and greater than the third frequency;
the system further comprising:
transport layer circuitry comprising:
a pulse stretcher comprising:
an input interface to receive the fourth reference signal (SYSREF_PULSE_div1) and the third clock signal (CLK_div1);
an output interface to supply a periodic fifth reference signal (sysref_2pulses_div1) having the third frequency, with a pulse width wider than the fourth reference signal (SYSREF_PULSE_div1);
a pulse converter comprising:
an input interface to receive the fifth reference signal (sysref_2pulses_div1) and the nth clock signal (CLK_divn); and,
an output interface to supply a periodic sixth reference signal (SYSREF_PULSE_divn) having the fourth frequency.

8. The system of claim 7 wherein the sixth reference signal (SYSREF_PULSE_divn) is synchronous with the second reference signal (SYSREF_2).

9. The system of claim 8 wherein the internal SYSREF generator further comprises:
a latching circuit comprising:
an input interface to accept the internal SYSREF signal (sysref_posedge_div1) and the second reset signal (sync_rstn);
an output to supply a periodic seventh reference signal (ALL_SYSREF_PULSES_div1);
wherein the transport layer circuitry has an input interface to accept the seventh reference signal (ALL_SYSREF_PULSES_div1) and the local multiframe clock signal (LMFC_div1).

10. The system of claim 9 further comprising:
link layer circuitry comprising:
an input interface to accept the nth clock signal (CLK_divn) and the sixth reference signal (SYSREF_PULSE_divn).

11. The system of claim 1 wherein the first circuit is an analog circuit.

12. A method for SYStem REFerence (SYSREF) signal synchronization, the method comprising:
accepting a first clock signal (CLK_1) having a first frequency, and a first system reference signal (SYSREF_1) associated with the first clock signal;
supplying, to a first circuit, a second clock signal (CLK_2) having the first frequency, and a periodic second system reference signal (SYSREF_2) having the first frequency, after a SETUP/HOLD delay responsive to the second clock signal;
a divider network:
dividing the second clock signal (CLK_2) to supply a third clock signal (CLK_div1) having a third frequency less than the first frequency;
dividing the second system reference signal (SYSREF_2) to supply a periodic third reference signal (SYSREF_div1) having the third frequency;
generating a validity pulse (VALID_SYSREF) in response to receiving a circuit stabilization acknowledgement from the first circuit;
a synchronization network generating a periodic internal SYSREF signal (sysref_posedge_div1) in response to receiving the third clock signal (CLK_div1) and the third reference signal (SYSREF_div1), subsequent to receiving the validity pulse (VALID_SYSREF); and,
the synchronization network supplying the internal SYSREF signal (sysref_posedge_div1) to a second circuit.

13. The method of claim 12 wherein the internal SYSREF signal (sysref_posedge_div1) is synchronous with the second system reference signal (SYSREF_2).

14. The method of claim 12 wherein the first clock signal (CLK_1) and first system reference signal (SYSREF_1) are responsive to external clock and SYSREF signals that satisfy the requirements of a JESD204B/204C specification.

15. The method of claim 12 wherein supplying the internal SYSREF signal (sysref_posedge_div1) to the second circuit includes supplying the internal SYSREF signal to a local multiframe clock (LMFC) network;
the method further comprising:
subsequent to a first predetermined number of initial internal SYSREF signal pulses, supplying:
a periodic fourth reference signal (SYSREF_PULSE_div1) synchronized with the internal SYSREF signal (sysref_posedge_div1); and,
a periodic local multiframe clock signal (LMFC_div1), synchronized with the internal SYSREF signal, having a periodicity of (K·F), where:
K=the number of frames in a multiframe; and,
F=the number of octets in a frame.

16. The method of claim 15 further comprising:
in response to accepting the third clock signal (CLK_div1) and the third reference signal (SYSREF_div1), a sysref monitor supplying a monitor signal verifying that the third reference signal (SYSREF_div1) has a constant period, regardless of the validity pulse (VALID_SYSREF) state.

17. The method of claim 16 further comprising:
a reset synchronizer supplying a reset signal (sync_rstn) in response to every occurrence of the third clock signal (CLK_div1) pulse;
wherein the synchronizer network, LMFC network, and the system monitor are reset after the receipt of each reset signal.

18. The method of claim 15 further comprising:
the divider network supplying an nth clock signal (CLK_divn) having a fourth frequency less than the first frequency and greater than the third frequency;
a transport layer pulse stretcher receiving the fourth reference signal (SYSREF_PULSE_div1) and the third clock signal (CLK_div1), and supplying a periodic fifth reference signal (sysref_2pulses_div1) having the third frequency, with a pulse width wider than the fourth reference signal (SYSREF_PULSE_div1); and,
a transport layer pulse converter receiving the fifth reference signal (sysref_2pulses_div1) and the nth clock signal (CLK_divn), and supplying a periodic sixth reference signal (SYSREF_PULSE_divn) having the fourth frequency.

19. The method of claim 18 wherein the sixth reference signal (SYSREF_PULSE_divn) is synchronous with the second reference signal (SYSREF_2).

20. The method of claim 19 further comprising:
link layer circuitry accepting the nth clock signal (CLK_divn) and the sixth reference signal (SYSREF_PULSE_divn).

21. The method of claim 12 wherein the first circuit is an analog circuit.

* * * * *